United States Patent [11] 3,614,665

[72] Inventors Carroll E. Weller; Robert J. McNair, both of Cincinnati, Ohio

[21] Appl. No. 25,928
[22] Filed Apr. 6, 1970
[45] Patented Oct. 19, 1971
[73] Assignee Avco Corporation Cincinnati, Ohio
Continuation of application Ser. No. 713,943, Mar. 18, 1968, now abandoned.

[54] VOLTAGE-CONTROLLED OSCILLATOR WITH DIGITAL PRESET

3 Claims, 6 Drawing Figs.

[52] U.S. Cl. .......... 331/101, 331/36 C, 331/36 L, 331/177 D, 331/177 V, 331/179, 331/181, 333/82 B
[51] Int. Cl. .......... H03b 5/18
[50] Field of Search .......... 331/36 C, 36 L, 101, 96, 117 D, 179, 181, 177 V; 333/82 B, 83 R; 334/15, 55

[56] References Cited

UNITED STATES PATENTS

| | | | |
|---|---|---|---|
| 3,139,593 | 6/1964 | Kaminski et al. .......... | 331/36 C X |
| 3,204,198 | 8/1965 | Bachnick .......... | 331/177 V X |
| 3,246,266 | 4/1966 | Racy .......... | 331/101 X |
| 3,295,070 | 12/1966 | Tewksbury et al. .......... | 331/179 |
| 3,319,187 | 5/1967 | Crandall .......... | 331/101 X |

FOREIGN PATENTS

| | | | |
|---|---|---|---|
| 651,369 | 10/1962 | Canada .......... | 331/179 |

*Primary Examiner*—Roy Lake
*Assistant Examiner*—Siegfried H. Grimm
*Attorney*—Charles M. Hogan

ABSTRACT: This is a voltage-controlled oscillator. The tank circuit of the oscillator comprises a plurality of capacitors, the capacitance magnitudes of which are related to each other in binary fashion. Also incorporated in this tank circuit is a voltage variable capacitor, to which a bias is applied for tuning purposes. By programmed switching one or more of the aforementioned capacitances are switched into the tank circuit, so as to bring the oscillator within the pull-in range of a phase lock loop. The elements of the oscillator are related to a coaxial line structure. The invention further provides a convenient mounting on which the tank circuit parameters are arranged. The various lumped capacitances in the tank circuit are switched in and out by PIN diodes.

INVENTORS
CARROLL E. WELLER
ROBERT J. McNAIR
BY Charles M. Hogan
ATTORNEY

INVENTORS
CARROLL E. WELLER
ROBERT J. McNAIR
BY
Charles M. Hogan
ATTORNEY.

VOLTAGE-CONTROLLED OSCILLATOR WITH DIGITAL PRESET

This is a continuation of our U.S. Pat. application, Ser. No. 713,943, filed in the U.S. Pat. Office on Mar. 18, 1968, entitled "Voltage Controlled Oscillator with Digital Preset," assigned to Avco Corporation, and now abandoned.

THE INVENTION AND ITS OBJECTS

It is common practice to employ a voltage-controlled oscillator in the synthesizers of radio communications systems. In this environment there arises the problem of presetting the voltage controlled oscillator to any one of a desired number of bands within the frequency spectrum. From the nature of the oscillator it is preset by the application of a suitable voltage in such manner as to be within the pull-in range of a phase lock loop. As is well known to those of skill in the art, a phase lock loop consists principally of a phase detector, a voltage-controlled oscillator, and a low pass or tracking filter. The voltage-controlled oscillator is proportioned to generate an approximation of the frequency of a standard or reference signal. The phase detector compares the generated signal with the reference signal. The output of the phase detector is a control voltage which is directly proportional to the cosine of the phase angle between the two signals. Once locked in, the oscillator is automatically maintained at the desired frequency by the phase lock loop. The present invention is directed to arrangements for presetting the oscillator so that the generated frequency is within the pull-in range.

It is common practice to utilize voltage-variable capacitors (i.e. varactors) as the voltage dependent element in a voltage controlled oscillator, i.e. the element to which a predetermined voltage is applied in order to preset the oscillator to a desired frequency, and to which the output of the phase detector is applied in order to lock in the oscillator at that frequency.

The generation of a voltage appropriate for presetting of a voltage-controlled oscillator to a desired frequency is not a simple matter. Since the graph of voltage against capacitance for a varactor does not plot in a linear fashion, there is need to generate preset voltage values which do not vary in a linear manner with changes in frequency bands. If the voltage is an analog voltage or if it contains an analog component, it is subject to the pickup of induced noise which is disturbing to the operation of the oscillator. The initial production of a preset voltage of digital character, followed by its conversion to an analog voltage in a digital-to-analog converter also presents many complexities, including the provision of a converter capable of generating an analog function which accords with the nonlinear voltage against capacitance graph of a varactor.

A principal object of the invention is to provide a simplified arrangement in which the frequency of operation of the oscillator can be changed through a wide range, by digital logic control means.

Another object of the invention is to provide an arrangement in which presetting of the oscillator is accomplished by simple programming, such as opening or closing switches.

A further object of the invention is to provide a voltage-controlled oscillator utilizing a relatively small number of varactors.

For a better understanding of the invention, together with other and further objects, advantages and capabilities thereof, reference is made to the following description of the accompanying drawings.

DETAILED DESCRIPTION OF A PREFERRED EMBODIMENT OF THE INVENTION

Figure 1:
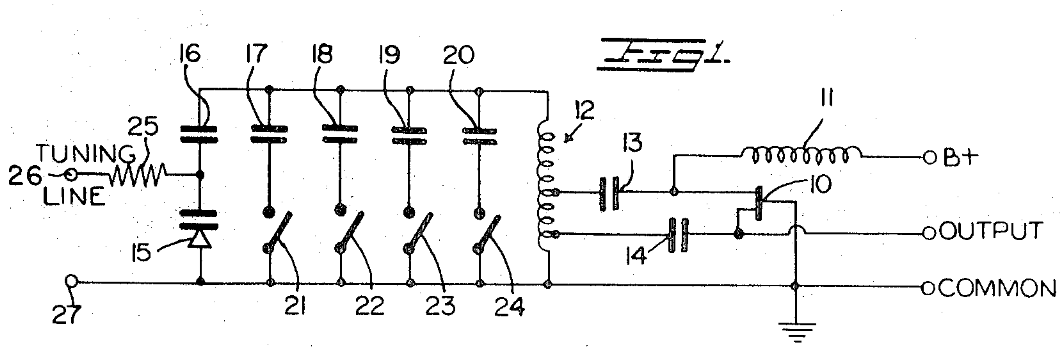
FIG. 1 is a circuit schematic of a voltage-controlled oscillator in accordance with the invention.

Reference is now made to FIG. 1 in which there is shown a preferred form of a voltage-controlled oscillator in accordance with the invention. It comprises an active element or transistor 10, a radiofrequency choke 11, an inductor 12, coupling capacitors 13 and 14, a varactor 15, tuning capacitors 16, 17, 18, 19, 20, switches 21, 22, 23 and 24, and an isolation resistor 25.

Field effect transistor 10 has one of its terminals grounded and the other two individually coupled by capacitors 13 and 14 to inductor 12, which is shunted by the series combination of varactor 15 and capacitor 16, and also by one or more of the tuning capacitors selected from among the elements 17–20. Bias is supplied to the varactor 15 via resistor 25.

The frequency-determining elements of the tank circuit of the FIG. 1 oscillator comprise:

Inductor 12, the series combination of capacitor 16 and varactor 15, in shunt with inductor 12; and the selected parameter from among capacitors 17–20, also in shunt with inductor 12.

The resonant frequency of the oscillator is determined by two factors: first, the magnitude of the biasing voltage impressed on the varactor; second, the opened and closed conditions of the various switches 21–24, and the resultant magnitude of the capacitance parameter which they introduce into the tank circuit.

An oscillator in accordance with the present invention is preset by logic means (not shown) prior to lock-in. A suitable voltage of analog character is provided and applied to the input terminals 26 and 27, in order to accomplish lock-in and bring the oscillator frequency into synchronism with the reference source. The capacitors 13 and 14 couple the field effect transistor 10 to the tank circuit at the appropriate impedance level. Energy to sustain oscillations is applied to the field effect transistor 10 from a suitable primary energy source (designated by B+, not shown), via radiofrequency choke 11.

Let it now be assumed that the capacitors 17–20 are related in value as a binary sequence so that their respective capacitances are 1 picofarad, 2 picofarads, 4 picofarads, and 8 picofarads. Positioning of the switches 21–24 can provide any value of shunt capacitance from zero to 15 picofarads in steps of 1 picofarad. Let it further be assumed that capacitor 16 and varactor 15 have a net magnitude of 15 picofarads when varactor 15 is biased to some arbitrary midrange value. Under the conditions assumed, the frequency of operation of the oscillator can be doubled by progressively opening and closing the switches 21–24 in a manner appropriate to build up the shunt capacitance from 1 to 15 picofarads.

The four switches 21–24 provide 16 possible combinations. From the foregoing it follows that an oscillator of FIG. 1, having the arbitrarily selected capacitance values mentioned above, can be preset to approximately 6 percent of any desired frequency across an octave of bandwidths. Moreover, preset is accomplished by programming the opening and closing of switches. Switching per se is well within the skill of those versed in the art of providing digital logic means for the control of electronics communications systems.

Figure 2:
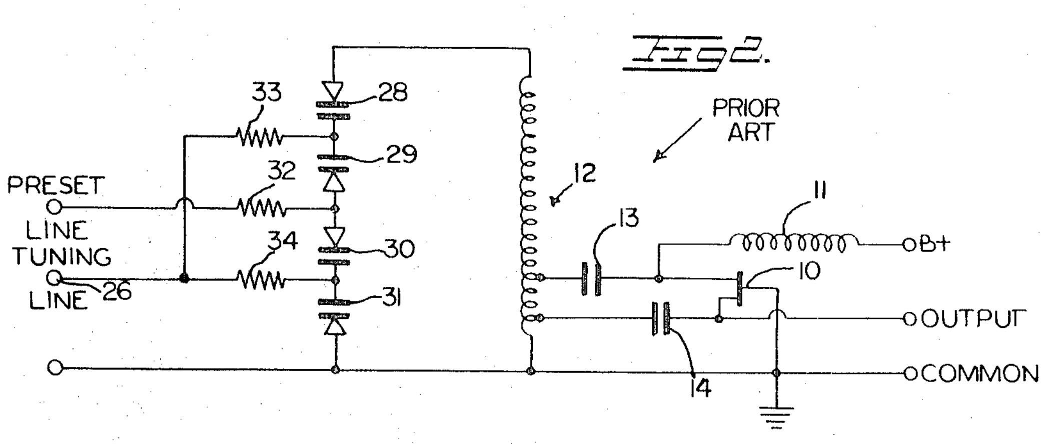
FIG. 2 is a circuit schematic of the conventional prior art voltage-controlled oscillator.

Let the oscillator of FIG. 1 be contrasted with the conventional voltage-controlled oscillator of FIG. 2 to which reference is now made.

In FIG. 2 the elements 10, 11, 12, 13 and 14 are identical in structure and function to the elements bearing like reference numerals in FIG. 1. In the FIG. 2 embodiment the frequency of oscillation is determined by a chain of varactors 28, 29, 30 and 31, which chain is included in the tank circuit and in shunt with the inductor 12. There is applied, via a present line and isolating resistor 32, an analog voltage, which typically ranges between 10 and 40 volts in magnitude, to bring the voltage-controlled oscillator within the pull-in range of a phase lock loop. Parenthetically, note that this gross voltage is dispensed with in the FIG. 1 embodiment, the result being accomplished in FIG. 1 by switching. When the oscillator of FIG. 2 is within the pull-in range of, say, a phase lock loop, another analog voltage, proportional to frequency error, is applied to the varactors via isolating resistors 33 and 34. The last-mentioned analog voltage has a polarity dependent on the direction of the frequency error. This tuning voltage originates at the phase detector of a phase lock loop, for example, and serves either to raise or to lower the operating frequency of the oscillator so as to make it track with a reference or standard. This last-mentioned voltage, as applied to terminals 26 and 27, for automatic or vernier operation, characterizing lock-in, is identical in function and purpose to the voltage applied at terminals 26, 27 of the FIG. 1 embodiment.

The disadvantages and limitations of prior art voltage-controlled oscillators, as mentioned above in the discussion of the objects of the present invention, characterize conventional voltage-controlled oscillators of the type shown in FIG. 2. What the present invention accomplishes, inter alia, is to substitute switching for the generation and utilization of the analog preset voltage. It has been seen that the magnitude of such preset voltage is not related in a linear manner to frequency. Additionally, it is quite difficult to obtain more than a 40–50 percent change in the frequency generated by a voltage-controlled oscillator of the type shown in FIG. 2. By contrast, it has been demonstrated that the FIG. 1 embodiment can provide a range of one octave with the values arbitrarily assigned. There are no theoretical system limitations in FIG. 1 and the number of capacitors and the number of switches for inserting the capacitors may be increased to any desired value. Whatever limitations there may be are collateral and not related to the fact of switching. Contrast this with the limitations of an analog preset voltage.

THE INVENTION AS INCORPORATED IN A SYSTEM HAVING A PHASE LOCK LOOP

Figure 3:
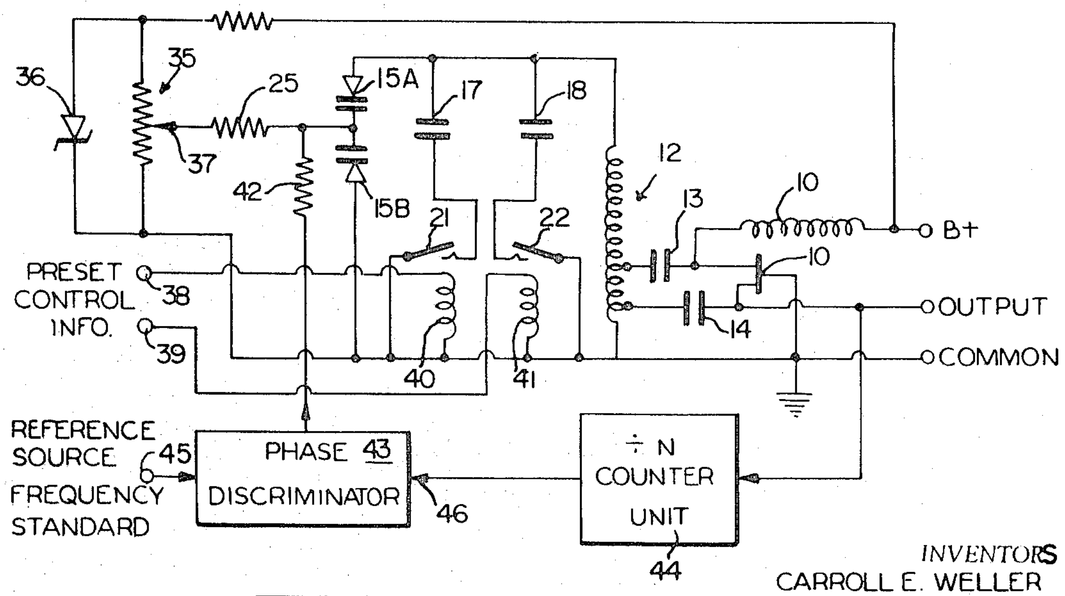
FIG. 3 is a circuit schematic of a voltage-controlled oscillator in accordance with the invention as incorporated in a phase lock in a synthesizer system.

Reference is now made to FIG. 3 which illustrates the voltage-controlled oscillator of the invention, as incorporated in a phase lock loop of a synthesizer. The community among elements of FIGS. 1 and 3, with respect to elements alike in structure and function, is indicated by identity of reference numerals, where appropriate, in order to avoid unnecessary duplication of description.

The reference numerals 15A and 15B in FIG. 3 designate varactors. A fixed bias is applied to varactors 15A and 15B, as determined by the setting of the contact 37 of potentiometer 35, the voltage of which is stabilized by a shunt zener diode 36. The requisite intelligence for purposes of presetting is applied via input terminals 38 and 39 to the actuating coils 40 and 41, associated with switches 21 and 22, respectively. These switches are representative of any combination selected and designated by digital logic (not shown).

It is well within the skill of the art to indicate the selection of the desired switches by appropriate commands. The commands so applied via input terminals 38 and 39, being digital and produced by a digital logic system (not shown), cause the switching to be performed, and in the illustrative embodiment shown, close switches 21 and 22, for example, thereby presetting the voltage-controlled oscillator of FIG. 3 within the pull-in range of the phase lock loop. In addition to any fixed bias which may be provided via isolating resistor 25, there is applied to the varactors a component of biasing voltage, via resistor 42, which is in series with the output of a tracking filter and phase discriminator unit shown in block form at 43. The function of this unit is to supply to the varactors a control potential which is a function of error, i.e. deviation from a reference frequency, whereby the voltage-controlled oscillator is controlled in a manner to effect phase lock or synchronism. Once the oscillator is brought within the pull-in range, by switching, the phase lock action is conventional, the phase discriminator and tracking filter 43 producing an analog voltage proportional to frequency error, related in magnitude and polarity to the magnitude and direction, respectively, of whatever error may instantaneously exist. The application of this frequency correcting voltage varies the capacitance of voltage variable capacitors 15A and 15B, so as to correct the frequency of the voltage-controlled oscillator.

The function of the divide-by-N counter unit 44, which is intercoupled between the output of the oscillator and one of the two basic inputs of the phase discriminator unit 43, is to convert the output frequency of the voltage-controlled oscillator to a lower frequency, for purposes of comparison to the reference or standard. The reference or standard frequency is produced by a conventional source, now shown, and is applied to the other basic input of the phase discriminator as shown at 45.

Assume a FIG. 3 arrangement of which the output of the voltage-controlled oscillator is 100 megahertz, that the system tunes to channels spaced by 1 kilohertz, and that the standard applied to input 45 is a 1 kilohertz square wave derived by dividing a 1-megahertz signal standard by 1,000. On this assumption, the divide-by-N counter would be proportioned so as to accomplish a division appropriate to make the frequency applied at input 46 to phase discriminator 43 equal to 1,000 hertz. Under this circumstance, if counter 44 is set to divide by 100,000, the output of the phase discriminator would be an analog voltage proportional to the instantaneous difference in frequency of the two inputs to the phase discriminator. When the radio set is tuned to a different channel the dividing function of the counter unit 44 is altered so that the voltage-controlled oscillator can phase lock to the new channel. If the channels are 1 kilohertz apart, and the system was tuned to the next channel below 100 megahertz, then the counter 44 would be changed in order to divide by 99,999.

Figures 4, 5:
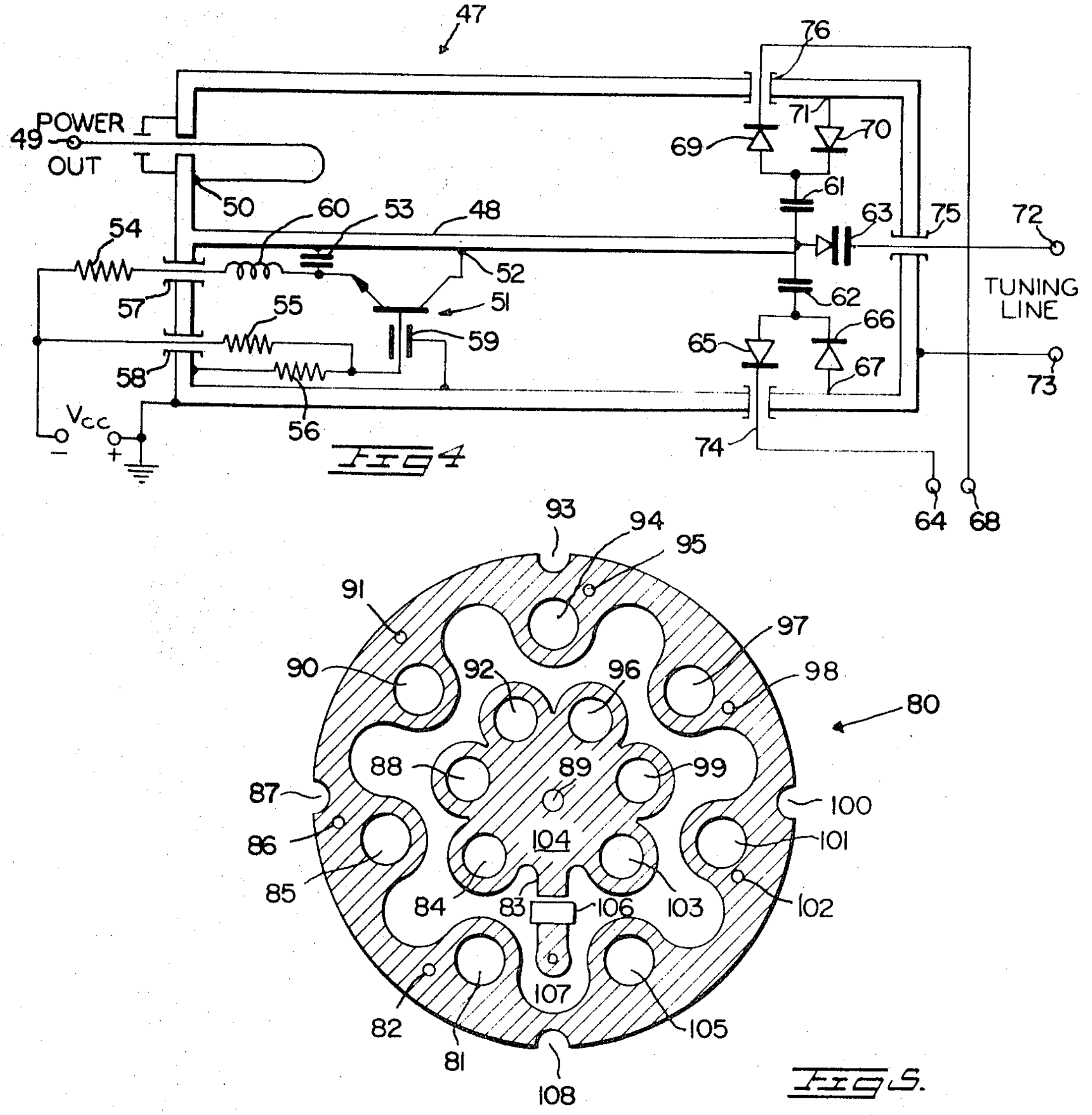
FIG. 4 is a circuit schematic of an alternate embodiment of the invention which utilizes a coaxial cavity.
FIG. 5 is a sectional view, showing a printed circuit board incorporating step sequence capacitors as utilized in the oscillator of the invention.

The invention may be embodied in many forms. The element 12 of FIGS. 1 and 3 could be a helical resonator, for example. A coaxial cavity type of oscillator is illustrated in FIG. 4. It has been successfully reduced to practice and tested and found to be operable through a frequency range of 260 to 360 megahertz.

Thus it will be seen that FIG. 3 comprises a system for the generation of synchronized oscillations in any one of a band of frequencies. The invention there shown comprises in combination, a number of elements. FIrst, there is a source of reference signals which are applied at 45. Second, there is a comparator device 43 which has an output and inputs 45, 46, to which the reference signals and the generated oscillations, when appropriately factored for comparison, are applied. The generated oscillations are put into an order appropriate for comparison by the dividing element 44. The generator of oscillations has a tank circuit comprising the voltage-controlled elements 15A and 15B and a reactance 12 of one kind and reactances 17 and 18 of another kind. The last-mentioned reactances are switchable by switches 21 and 22 in discrete steps corresponding to individual bands. The element 44 comprises means for putting the oscillations and the reference signals into an order appropriate for comparison. Control information is applied to the means 40–41 for switching the tuning capacitors 17 and 18 to bring the generator of oscillations into the pull-in range of the phase lock loop, i.e. within control of the output of the comparator, which output then maintains the desired synchronism. That is, the output of the comparator 43 is coupled to the voltage-controlled elements 15A and 15B to lock into synchronism the generated oscillations as transformed by the element 44 and the reference signals as applied at 45, the transformed oscillations and the reference signals being of a proper order for comparison.

AN ALTERNATE EMBODIMENT OF THE INVENTION

In the FIG. 4 embodiment there is shown a generally cylindrical cavity 47 substantially closed at both ends. To one end there is securely secured a central rod or conductor 48. The elements 47 and 48 are of materials having good conductive properties. While the axial length of the cavity is not critical, it may, and generally will be, between one-eighth and one-sixteenth wavelength. A conductive loop projects from output terminal 49 through the closed end to which its return portion is conductively fastened at 50. A suitable location for the active element 51 is within the cavity but it may be placed in exterior relation to the cavity. The collector of the transistor 51 is connected to the central conductor 48 at 52 and the emitter is coupled to the central conductor by a capacitor 53, the attachments being at points where the appropriate impedance match occurs. During the oscillatory state there is a current node at the ground plane (the left end of the cavity) whereat the impedance is zero. Progressing from that end toward the right, impedance increases and would reach a maximum value after a quarter wavelength of travel. In the embodiment which has been reduced to practice the emitter coupling is at an impedance value of about 50 ohms and the impedance at point 52 is slightly higher. The emitter resistor 54 and the base resistor 55, both terminating at the negative terminal of a source of bias currents (not shown), in conjunction with resistor 56, between base and ground plane, serve properly to bias the oscillator circuit and the capacitors 57, 58 and 59 furnish grounds for radiofrequencies. Radiofrequency choke 60, in series with the emitter, permits the emitter to float above ground, as far as RF is concerned.

The resonant frequency of the cavity is changed by varying the capacitive end loading of the central conductor, i.e. by switchable tuning capacitors 61 and 62, together with varactor 63, each having a terminal connected to central conductor 48. A first PIN diode circuit can be traced from terminal 64 via PIN diode 65, PIN diode 66, and a connection to the cavity at 67.

A second PIN diode circuit can be traced from terminal 68, PIN diode 69, PIN diode 70, and a connection 71 to the cavity. The remaining terminal of capacitor 61 is connected to the line interconnecting diodes 69 and 70 and the remaining terminal of capacitor 62 is similarly connected to the conductor connecting diodes 65 and 66. The purpose of diodes 69 and 70 is to switch capacitor 61 in and out of circuit. Similarly, the purpose of diode 65 and 66 is to switch capacitor 62 in and out of circuit. Capacitor 61, for example, is switched into circuit by applying a negative voltage on terminal 68 with respect to ground 73. It will be understood that the generated frequency depends on the total capacitance provided by the varactor 63 and the selected tuning capacitor. One or more of the lumped capacitors 61 and 62 is selected by digital logic applied to terminals 64 and 68 in the form of pulse commands.

Bias is applied to the varactor 63 via the usual tuning line input terminals 72 and 73. That is to say, when the FIG. 4 embodiment is incorporated in a system including phase lock, the output of the phase discriminator is applied as a voltage component to the terminals 72 and 73 to control the net bias on varactor 63, thereby to cause the oscillator to pull in and to remain in phase lock. The feed-through capacitors 74, 75 and 76 illustrated in FIG. 4 serve to provide an RF path to ground and also prevent leakage of radiofrequency energy from the cavity.

A MODIFIED FORM OF THE INVENTION

FIG. 5 shows a means of assembling a step-sequenced capacitor tuner section of a voltage-controlled oscillator in accordance with FIG. 4. The printed circuit board 80 shown in FIG. 5 mounts via aperture 89 near the right end of center rod 48 of FIG. 4. Six capacitors, such as preset tuning capacitors 61 and 62 of FIG. 4 are mounted in the inner ring of holes 84, 88, 92, 96, 99 and 103. While only two tuning capacitors are shown in the FIG. 4 version, any number can be accommodated, as demonstrated by FIG. 5.

The printed circuit board may be so arranged that these capacitors slip in holes 84, 88, 92, 96, 99 and 103 and make electrical contact with metallic area 104 via threaded screw arrangements, for example. Six feed-through capacitors such as those shown at 74 and 76 in FIG. 4 are mounted in holes 81, 85, 90, 94, 97 and 101 in the intermediate ring of FIG. 5. Capacitor 75 of FIG. 4 mounts in hole 105 of FIG. 5. Varactor 63 of FIG. 4 fits in slot 106 and makes electrical contact with lands 83 and 107.

The PIN diodes such as are shown at 70 and 66 of FIG. 4, for example, are mounted in the outer ring of holes 82, 86, 91, 95, 98 and 102, thence connect to the unsupported ends of the capacitors inserted in holes 84, 88, 92, 96, 99 and 103. The remaining PIN diodes (functionally like 69 and 65 of FIG. 4) have one end connected to the above-mentioned unsupported ends of capacitors in holes 84, 88, 92, 96, 99 and 103, and the other ends individually respectively joined to the feed-through capacitors inserted in holes 81, 85, 90, 94, 97 and 101.

Land area 107 is wired to the feed-through capacitor 75 inserted in hole 105. The slots shown at locations 87, 93, 100 and 108 serve to rigidly attach the printed circuit board to the outer frame of the oscillator and at the same time serve as electrical ground contact points.

PRESET TUNING BY VARIATION OF INDUCTANCE

Figure 6:
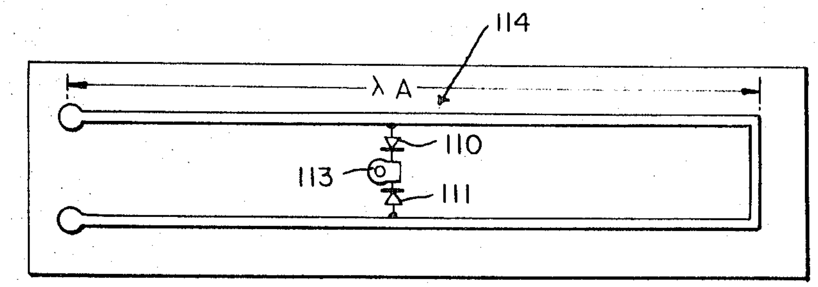
FIG. 6 shows an inductance element suitable for use in a further form of the invention.

While the embodiments so far described feature presetting by switching in lumped capacitances and thus selecting the capacitance parameter in a tank circuit or tuning network, it is within one aspect of the invention to select the tuning parameter as by the switching of lumped inductors or by switching into circuit a portion of a distributed inductance, for example. Note that the PIN diode switching technique is employed for activating the selected ones of tuning capacitors 61 and 62 in FIG. 4. In FIG. 6 there is shown an arrangement in which a distributed inductance in the form of a tuning line may be variably short circuited by a plurality of PIN diode circuits. In FIG. 6 a method of selecting a particular inductance parameter by short circuiting a tuning line at a particular point is shown. It comprises a PIN diode 110, a PIN diode 111, and an intermediate contact 113, all arranged in series across a predetermined point of a tuning line 114. It will be understood that switching arrangements such as 110–111 may be disposed at various section points along the length of the tuning conductor 114 illustrated in FIG. 6 so that by the use of digital commands and switching techniques similar to those applicable to the FIG. 4 embodiment the preset tuning may be accomplished by selection of the desired inductance parameters. In view of the foregoing, it will now be understood by those skilled in the art that the inductance parameter may be selected by switching in and out of a tuning circuit various lumped inductance elements.

While there has been shown and described what is at present considered to be the preferred embodiment of the present invention and a modified form found to be satisfactorily operable, it will be understood by those skilled in the art that various changes and modifications may be made without departing from the proper scope of the invention as defined in the appended claims.

We claim:

1. In an oscillator the combination comprising:

a conductive cavity having first and second substantially closed ends, a conductive central rod having two ends, of which one is secured to the first end of the cavity and the other terminates at a point spaced from the other end of the cavity, a varactor having two leads, of which one is connected to said other end of said rod and the other is adapted to be connected to a control potential terminal to vernier tune the oscillator through a range of frequencies, and means for presetting the oscillator to any one of a plurality of frequency steps comprising a plurality of tuning capacitors, each having a lead connected to said rod and diode switching means for individually effectively connecting said capacitors between said rod and said cavity, said tuning capacitors being so related to each other in value as to tune the oscillator digitally.

2. In an oscillator the combination comprising:

a conductive cavity having first and second substantially closed ends, a conductive central rod having two ends, of which one is secured to the first end of the cavity and the other terminates at a point spaced from the other end of the cavity, a varactor having two leads, of which one is connected to said other end of said rod and the other is adapted to be connected to a control potential terminal to vernier tune the oscillator through a range of frequencies, and means for presetting the oscillator to any one of a plurality of frequency steps comprising a plurality of tuning capacitors, each having a lead connected to said rod and switching diode means for individually effectively connecting said capacitors between said rod and said cavity, the respective values of said tuning capacitors being related to each other in binary sequence fashion so that digital logic means can be used to select any one or more of said capacitors.

3. The combination of an oscillator comprising:

a cylindrical conductive cavity having first and second substantially closed ends and being formed with first, second and third axially extending openings at its first end and a fourth opening at its second end and a plurality of additional radially extending openings;

a conductive central rod having two ends, of which one is secured to the first end of the cavity and the other terminates at a point spaced from the other end of the cavity;

a transistor having a collector connected to said rod and an emitter and a base;

a first coupling capacitor for coupling said base, at radiofrequencies, to the interior surface of said cavity, to provide a ground for said base;

a base bias resistor connected between said base and the first end of said cavity;

a supply circuit adapted to be connected to a source of bias currents and having a positive terminal, grounded to the exterior of said cavity, and also a negative terminal;

a base-biasing circuit comprising a second resistor connected between said base and said negative terminal;

an emitter-biasing circuit comprising a series combination of a third resistor and a choke connected between said emitter and said negative terminal;

a second coupling capacitor between said emitter and said rod;

a signal output connection extending from the interior surface of the first end of said cavity through one of the openings on that end, said biasing circuits extending through the other two openings on that end;

first, second and third feed-through capacitors disposed to define passageways for said signal output connection and said biasing circuits;

a varactor having two leads, of which one is connected to said other end of said rod and the other projects through said fourth opening to provide a control potential terminal; and a fourth feed-through capacitor disposed to define a passageway for said other varactor lead, the aforementioned elements providing oscillations locked within any one of a plurality of frequency ranges by control potential; and means for presetting the oscillator to any one of a plurality of ranges comprising:

a like plurality of tuning capacitors, each having a lead connected to said rod and a switch terminal;

a like plurality of pairs of switching diodes, each pair being connected to provide a series command circuit between the interior surface of said cavity resonator and the exterior of said cavity resonator, each command circuit extending through one of said radial openings;

a like plurality of additional feed-through capacitors disposed to define passageways for said command circuit, each switch terminal being connected to the junction of a pair of said switching diodes so that the application of a potential to any command circuit completes a ground connection, rendering operative its respective tuning capacitor as a frequency-range determining parameter;

and a circuit component-mounting wafer of circular form disposed on said rod and within said cavity, said wafer being formed with a central aperture embracing the rod, an inner concentrically arranged set of apertures to provide mountings for the tuning capacitors, a second concentric arranged set of apertures to provide mountings for the feed-through capacitors, a third concentric set of apertures to provide mountings for the switching diodes, and a slot to provide a mounting for said varactor, said wafer being printed to provide a common connection between the tuning capacitors and said rod.